(12) United States Patent
Haratani et al.

(10) Patent No.: US 6,292,353 B1
(45) Date of Patent: Sep. 18, 2001

(54) LAMINATED CERAMIC ELECTRONIC COMPONENT

(75) Inventors: Tatsuo Haratani; Yasunobu Yoneda, both of Takefu; Yoshikazu Takagi, Sabae, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/593,570

(22) Filed: Jun. 14, 2000

(30) Foreign Application Priority Data

Jun. 16, 1999 (JP) .................................................. 11-170051

(51) Int. Cl.[7] ...................................................... H01G 4/06
(52) U.S. Cl. ..................................... 361/321.2; 361/321.2; 361/321.3; 361/306.3; 361/311; 428/192; 428/209
(58) Field of Search ............................... 361/321.2, 321.5, 361/311, 313, 312, 306.3, 328, 321.4, 301.3, 301.4; 428/192, 209

(56) References Cited

U.S. PATENT DOCUMENTS

| | | | |
|---|---|---|---|
| 5,512,353 | * | 4/1996 | Yokotani et al. .................... 428/210 |
| 5,659,456 | * | 8/1997 | Sano et al. ......................... 361/321.4 |
| 5,712,758 | * | 1/1998 | Amano et al. ...................... 361/321.2 |
| 5,801,111 | * | 9/1998 | Wada et al. ........................... 501/138 |
| 5,812,363 | * | 9/1998 | Kuroda et al. .................... 361/306.3 |
| 5,933,318 | * | 8/1999 | Tomono et al. ...................... 361/323 |
| 5,985,414 | * | 11/1999 | Fukuda et al. ....................... 428/192 |

* cited by examiner

*Primary Examiner*—Dean A. Reichard
*Assistant Examiner*—Nguyen Ha
(74) *Attorney, Agent, or Firm*—Ostrolenk, Faber, Gerb & Soffen, LLP

(57) ABSTRACT

The present invention provides a reliable ceramic electronic component in which cracks are hardly generated in the ceramic sintered body when a heat impact is applied or even when a stress caused by bending of a printed circuit board after packaging is applied, wherein inner electrodes are disposed in the ceramic sintered body, and wherein a first and second outer electrodes are formed so as to cover the first and second end faces, the first and second outer electrodes comprising electrode cover members extending to the upper face and lower face, up to both side faces of the ceramic sintered body, and the distance e and the distance Lg satisfying the relation of $1.5 \times Lg \leq e \leq 3.5 \times Lg$, where e denotes a distance between the outermost side edge of the outer electrode and the inner side edge of the electrode cover member of the outer electrode, and Lg denotes the distance between the outermost side edge of the outer electrode and the tip of the inner electrode electrically connected to the outer electrode.

3 Claims, 2 Drawing Sheets

LAMINATED CERAMIC ELECTRONIC COMPONENT

BACKGROUND OF THE INVENTION

1. Field of the Invention

The present invention relates to a laminated ceramic electronic component such as a laminated capacitor and laminated varistor and, more specifically, to a laminated ceramic electronic component in which the electrode structure is improved.

2. Description of the Related Art

FIG. 3 is a vertical cross section showing one example of a conventional laminated capacitor.

The laminated capacitor 51 comprises a ceramic sintered body 52 constructed of a dielectric ceramic. A plurality of inner electrodes 53 to 56 are disposed in the laminated capacitor 51 so as to be stacked one on top of the other along the direction of thickness via respective ceramic layers. The inner electrodes 53 and 55 extend to one end face 52a of the ceramic sintered body 52, while the inner electrodes 54 and 56 extend to the opposite end face 52b. Outer electrodes 57 and 58 are formed so as to cover the end faces 52a and 52b, respectively.

The outer electrodes 57 and 58 of the laminated capacitor 51 include electrode cover members 57a and 58a which cover the upper face 52c and lower face 52d in order to be mounted on the surface of a printed circuit board.

The length of the electrode cover members 57a, 58a as measured along the direction between the end faces 52a and 52b, is as short as possible to achieve miniaturization of the laminated capacitor 51. As a result, the distance e between the inner side edge of the electrode cover members 57a, 58a and the outermost side edge of the electrodes 57, 58 are made to be relatively small in the conventional laminated capacitor 51. In the outer electrode 58, for example, the distance e is 1 to 1.5 times as long as Lg (the distance between the tips 53a and 55a of the inner electrodes 53 and 55, respectively, and the outer most side edge of the outer electrode 58). A similar relationship exists on left hand side of the capacitor.

When the laminated capacitor 51 is packaged on the printed circuit board by soldering, a heat pulse is applied to the laminated capacitor 51. In response to this heat pulse, the outer electrodes 57 and 58 and the inner electrodes 53 to 56 in the laminated capacitor 51 are more likely to contract than the ceramic material. This contraction stress tends to concentrate at the inner side edges of the cover members 57a and 58a of the outer electrodes 57 and 58, for example at the location indicated by arrow B in FIG. 3. Also, the heat pulse stress is readily concentrated at the tip portions of the inner electrodes 53 to 56 located within the ceramic sintered body 52. Accordingly, cracks are sometimes generated between the site indicated by the arrow B and the tip 53a of the inner electrodes 53.

When the printed circuit board suffers a temperature variation or is bent after the laminated ceramic capacitor has been mounted on the printed circuit, cracks as described above are liable to occur by a stress ascribed to bending or heat impact applied to the ceramic sintered body 52.

The distances e and Lg tend to be shorter as the laminated capacitor is miniaturized. Consequently, these cracks tend to be generated more frequently since the site indicated by the arrow B comes closer to the tip 53a of the inner electrode 53.

SUMMARY OF THE INVENTION

Accordingly, an object of the present invention is to provide a reliable laminated ceramic electronic component wherein the generation of cracks is reduced when a heat pulse is applied to the ceramic electronic component when it is mounted on the printed circuit board or when the circuit board is bent.

To this end, the present invention provides a laminated ceramic electronic component comprising: a ceramic sintered body having a first and second edge faces in opposed relation with each other; a plurality of inner electrodes, which is disposed so as to be stacked along the direction of thickness via a ceramic layer in the ceramic sintered body, pulled out of the first or second edge face; and a first and second outer electrodes formed so as to cover the first and second edge faces of the ceramic sintered body in opposed relation with each other, wherein the first and second outer electrodes comprise electrode cover members not only covering the first and second edge faces of the ceramic sintered body but also extending to the upper and lower faces, and to both side faces of the ceramic sintered body, and wherein the distance e between the outermost side edge of the outer electrode and the inner side edge of the electrode cover member of the outer electrode, and the distance Lg between the outermost side edge of the outer electrode and the tip of the inner electrode electrically connected to the opposed outer electrode, satisfy the following relation:

$$1.5 \times Lg \leq e \leq 3.5 \times Lg$$

Preferably, the distance e and the distance Lg is determined so as to satisfy the relation of $2.0 \times Lg \leq e \leq 3.5 \times Lg$.

While the laminated ceramic electronic component according to the present invention can be applied for various objects such as laminated capacitors, laminated varistors and laminated thermistors, the ceramic sintered body may be constructed using dielectric ceramics that is formed into a laminated capacitor in a specified aspect of the present invention.

BRIEF DESCRIPTION OF THE DRAWING(S)

Other features and advantages of the present invention will become apparent from the following description of the invention which refers to the accompanying drawings.

DETAILED DESCRIPTION OF EMBODIMENTS OF THE INVENTION

Figure 1:
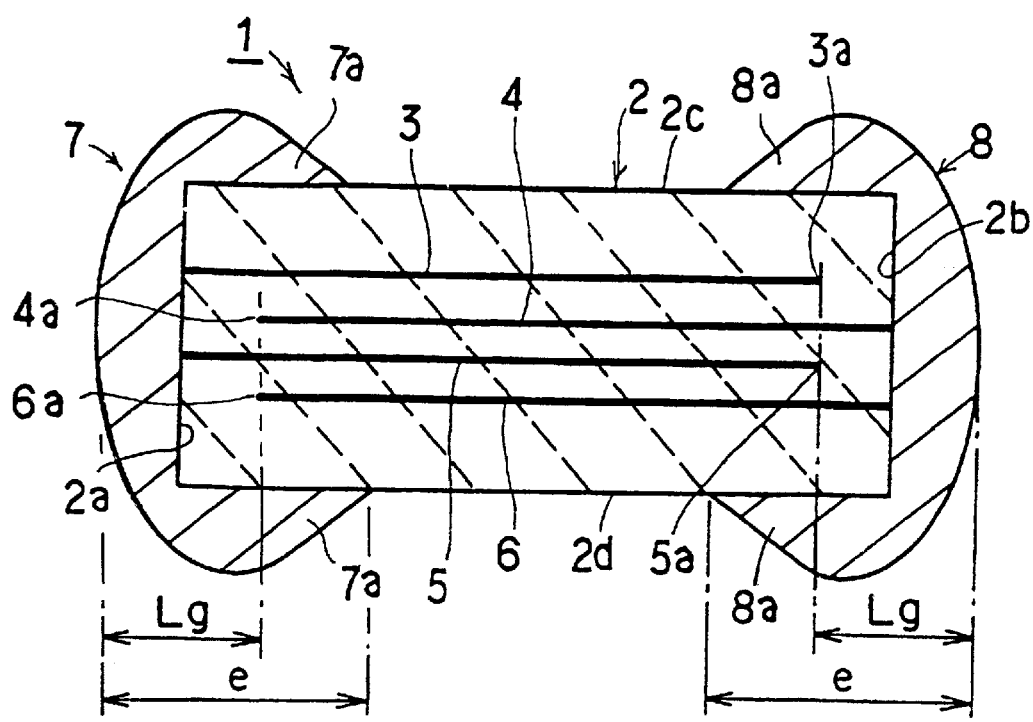
FIG. 1 is a vertical cross section showing a laminated capacitor as a laminated ceramic electronic component according to one embodiment of the present invention.

The present invention will be described with reference to the following embodiments.

The laminated capacitor 1 includes a rectangular column shaped ceramic sintered body 2 comprising a dielectric ceramic such as a barium titanate based ceramic.

A plurality of inner electrodes 3 to 6 are disposed in the ceramic sintered body 2 so as to be stacked along the thickness direction of the sintered body 2 via respective ceramic layers. The inner electrodes 3 to 6 are preferably made of a metallic material such as, for example, Ag, Ag—Pd and Ni.

The inner electrodes 3 and 5 extend to a first end face 2a of the ceramic sintered body 2, while the inner electrodes 4 and 6 extend to a second end face 2b which is opposed to the first end face.

Figure 2:
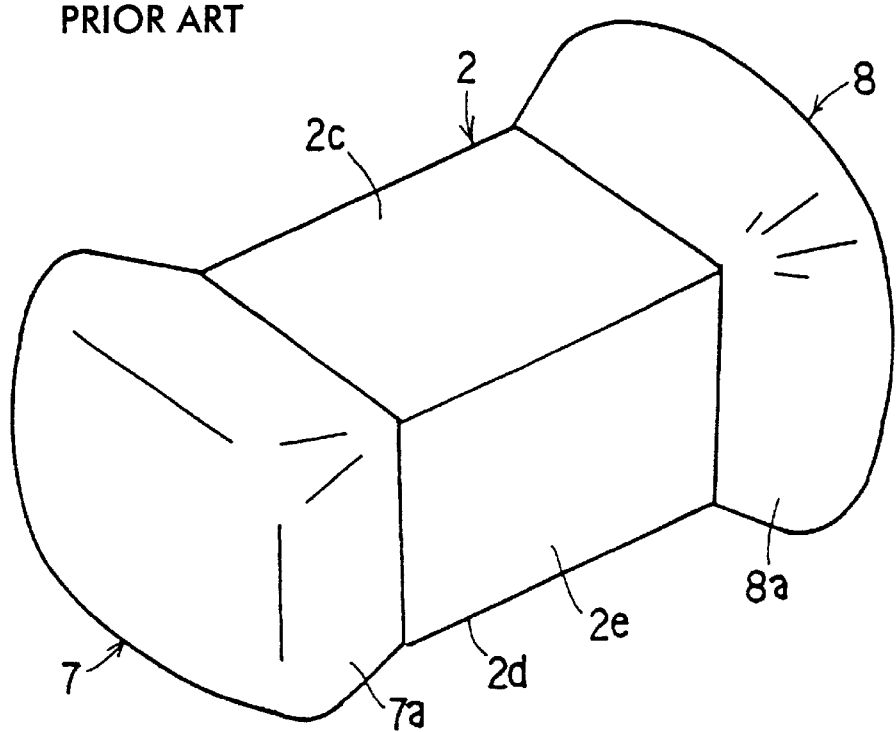
FIG. 2 is a perspective view showing the appearance of the ceramic capacitor of the example shown in FIG. 1.
Figure 3:
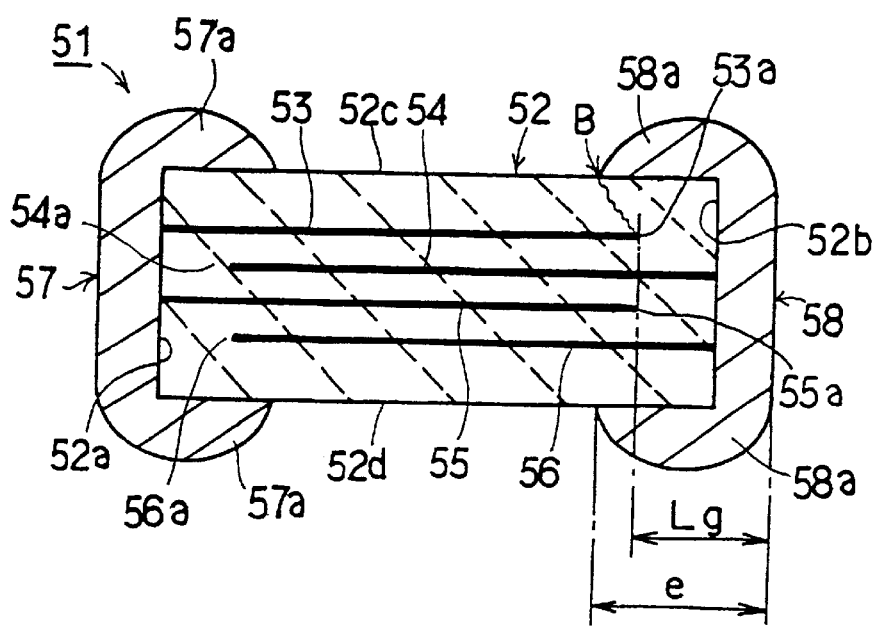
FIG. 3 is a vertical cross section showing the conventional laminated capacitor.

A first outer electrode 7 is formed so as to cover the end face 2a and is electrically connected to the inner electrodes 3 and 5. The outer electrode 7 extends over a portion of the upper and lower faces 2c and 2d, and to a pair of side faces 2e (one side face 2e is shown in FIG. 2). To this end, the outer electrode 7 includes an electrode cover member 7a which covers a portion of the upper face 2c, lower face 2d, and a pair of the side faces 2e.

Likewise, the outer electrode 8 is formed so as to cover the side face 2b of the ceramic sintered body 2, and includes an electrode cover member 8a which covers a portion of the upper face 2c, lower face 2d, and a pair of the side faces 2e.

According to the invention, both the electrode cover member 7a and the electrode cover member 8a satisfy the relation $1.5 \times Lg \leq e \leq 3.5 \times Lg$.

As shown in FIG. 1, the distance e corresponds to the distance between the outermost side edge of the outer electrode (e.g., the second outer electrode 8), and the inner side edge of the electrode cover member (e.g., the electrode cover member 8a). The direction toward the center of the ceramic sintered body is referred to as the inner side and the direction outward from the end surfaces 2a and 2b are referred to outer side.

The distance Lg is the distance between the outermost side edge of the outer electrode (e.g., outer electrode 8), and tips (e.g., the tips 3a and 5a) of the inner electrodes which are electrically connected to the opposite outer electrode (e.g., outer electrode 7).

The outer electrodes 7 and 8 may be formed as a laminate of a plurality of metal layers. In such a case, the outermost side edge of the outermost layer corresponds to the outermost side edge described above.

When the distances e and Lg satisfy the relation described above, the concentration of stress, caused by applying an external force due to bending of the board in packaging to the ceramic sintered body, or by applying a stress due to heat impact, is relaxed, thereby decreasing the generation of cracks. These phenomena will be described in more detail based on the following experimental results.

A mother ceramic green sheet whose thickness is about 8 μm after firing was prepared. Inner electrodes were screen-printed on the mother ceramic green sheet using a conductive paste.

Seventy ceramic green sheets on which the inner electrodes were printed with the conductive paste were laminated, and a laminated body was obtained by laminating 30 plain ceramic green sheets on respective upper and lower layers of the laminated body. After pressing the laminated body along the direction of thickness, it was cut along the same direction, obtaining a laminated body.

Then, each laminated body was fired to obtain a ceramic sintered body 2. A first outer electrode layer was formed by coating an Ag paste on opposite end faces of the ceramic sintered body 2. A Ni plating layer followed by a Sn plating layer were formed on the outer surface of the first outer electrode, thereby forming the first outer electrode 7. A second outer electrode 8 was also formed in the same manner. A laminated capacitor with a dimension of 2.0 mm in length, 1.25 mm in width and 1.0 mm in thickness was thus obtained.

Respective laminated capacitors denoted by the sample Nos. 1 to 6 in TABLE 1 below were obtained by determining the distance Lg to be 0.35 mm while variously changing the distance e in the laminated capacitor. Bending tests and heat impact tests were carried out as follows with respect to the laminated capacitor sample Nos. 1 to 6.

(1) Bending test: A bending force was determined by measuring a bending limit following JIS C-5102- 1994, items 8, 11 and 1. The larger numbers indicate that the laminated capacitor can endure a larger bending force.

(2) Heat impact test: A heat impact test of the laminated capacitor was carried out following JIS C-5102-1994, items 8 and 14, using a molten solder at a temperature of 300° C. The number of cracks in the laminated capacitor after being subjected to the heat impact test was observed.

The results are listed in TABLE 1 below.

TABLE 1

| | SAMPLE No. | | | | | |
|---|---|---|---|---|---|---|
| | 1 | 2 | 3 | 4 | 5 | 6 |
| DISTANCE e | 1.2 × Lg | 1.6 × Lg | 2.3 × Lg | 3.0 × Lg | 3.5 × Lg | 4.0 × Lg |
| BENDING FORCE (mm) (MIN. VALUE) | 2.8 (2.2) | 3.8 (2.8) | 4.7 (3.5) | 4.9 (3.8) | 5.1 (4.2) | 4.8 |
| NUMBER OF CRACKS BY SOLDER HEAT IMPACT | 45/200 | 2/200 | 0/200 | 0/200 | 0/200 | 0/200 |

As is evident from TABLE 1, sample Nos. 2 to 5, which fall within the range of the present invention, showed good results in both the bending test and heat impact test. In other words, the samples can endure larger bending force while generating an extremely small number of cracks in the heat impact test.

Sample No. 1, in which the distance e is smaller than 1.5×Lg, could endure only a small bending force and generated cracks in many laminated capacitors after the heat impact test.

It is evident from the comparison between the results in the sample Nos. 5 and 6 that the bending characteristics deteriorate when the distance e exceeds 3.5×Lg.

It is also evident from the results in the sample Nos. 3 to 5 that both of the bending characteristics and heat resistance turn out to be better than the other samples when the distance e is more than 2.0×Lg and less than 3.5×Lg.

The laminated ceramic electronic component according to the present invention satisfies the relation of 1.5× Lg≦e≦3.5×Lg, where e denotes a distance between the outermost side edge of the outer electrode and the inner side edge of the electrode cover member of the outer electrode, and Lg denotes the distance between the outermost side edge of the outer electrode and the tip of the inner electrode electrically connected to the outer electrode. Accordingly, concentration of stress in the laminated ceramic electronic component can be relaxed, even when a stress caused by bending of the circuit board is applied in packaging the laminated ceramic electronic component on the circuit board. Concentration of stress caused by heat impact can be likewise relaxed even when a heat impact by soldering is applied to the laminated ceramic electronic component, thereby generation of cracks in the ceramic sintered body can be effectively suppressed to enable a reliable laminated ceramic electronic component to be provided.

Although the cracks in the ceramic sintered body ascribed to the concentration of stress as described above are liable to be generated when the laminated ceramic electronic component has a small size, the generation of cracks can be effectively suppressed according to the present invention even when the size of the laminated ceramic electronic component is reduced. When the present invention is applied to a small size laminated ceramic electronic component having a large capacitance—for example a dimension of 2 mm or less in length, 1.25 mm or less in width and 1.0 mm or less in thickness, and the number of lamination of the inner electrodes of 100 layers or more; or a dimension of 1 mm or less in length, 0.5 mm or less in width and 0.5 mm or less in thickness, and the number of lamination of the inner electrodes of 50 layers or more—the present invention is particularly effective.

When the relation of $2.0 \times Lg \leq e \leq 3.5 \times Lg$ is met, the concentration of stress in the ceramic sintered body can be effectively relaxed, thereby suppressing the generation of cracks in the ceramic sintered body.

Accordingly, generation of cracks in the ceramic sintered body can be effectively suppressed in packaging the electronic components on the printed circuit board or during use, when a dielectric ceramic is used as the ceramic sintered body to construct a laminated capacitor, thereby allowing a reliable laminated capacitor to be provided.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A laminated ceramic electronic component comprising:
    a ceramic sintered body having first and second opposing end surfaces and top, bottom, first and second side surfaces, the dimension extending between the top and bottom surfaces defining the thickness direction of the ceramic sintered body;
    a plurality of inner electrodes, disposed so as to be stacked along the thickness direction of the ceramic sintered body with respective ceramic layers located therebetween, at least some of the inner electrodes extending to the first end surface and at least some of the inner electrodes extending to the second end surface; and
    first and second outer electrodes covering the first and second end surfaces of the ceramic sintered body, respectively, each of the outer electrodes including electrode cover members which cover a portion of the top, bottom, first and second side surfaces of the ceramic sintered body; and
    wherein each of the respective first and second outer electrodes meet the condition:

$$1.5 \times Lg \leq e \leq 3.5 \times Lg$$

wherein e is the distance between the outermost side edge of the respective outer electrode and the inner side end of its electrode cover member, and Lg is the distance between the outermost side edge of the respective outer electrode and the tips of the inner electrodes which are electrically connected to the other outer electrode.

2. A laminated ceramic electronic component comprising:
    a ceramic sintered body having first and second opposing end surfaces and top, bottom, first and second side surfaces, the dimension extending between the top and bottom surfaces defining the thickness direction of the ceramic sintered body;
    a plurality of inner electrodes, disposed so as to be stacked along the thickness direction of the ceramic sintered body with respective ceramic layers located therebetween, at least some of the inner electrodes extending to the first end surface and at least some of the inner electrodes extending to the second end surface; and
    first and second outer electrodes covering the first and second end surfaces of the ceramic sintered body, respectively, each of the outer electrodes including electrode cover members which cover a portion of the top, bottom, first and second side surfaces of the ceramic sintered body; and
    wherein each of the respective first and second outer electrodes meet the condition:

$$2.0 \times Lg \leq e \leq 3.5 \times Lg$$

wherein e is the distance between the outermost side edge of the respective outer electrode and the inner side end of its electrode cover member, and Lg is the distance between the outermost side edge of the respective outer electrode and the tips of the inner electrodes which are electrically connected to the other outer electrode.

3. A laminated ceramic electronic component according to claim 1 or 2, wherein the ceramic sintered body is constructed using a dielectric ceramic which is formed into a laminated capacitor.

* * * * *